US012684283B2

(12) United States Patent
Xu et al.

(10) Patent No.: US 12,684,283 B2
(45) Date of Patent: Jul. 14, 2026

(54) MICRO SPEAKER STRUCTURE WITH ACOUSTIC MESH

(71) Applicant: Fortemedia, Inc., Alviso, CA (US)

(72) Inventors: Yu-Xuan Xu, Hsinchu City (TW);
Bin-Rong Li, Taipei City (TW);
Guan-Jun Huang, Hsinchu City (TW);
Shih-Chin Gong, Taipei City (TW)

(73) Assignee: FORTEMEDIA, INC., Alviso, CA (US)

( * ) Notice: Subject to any disclaimer, the term of this patent is extended or adjusted under 35 U.S.C. 154(b) by 125 days.

(21) Appl. No.: 18/762,225

(22) Filed: Jul. 2, 2024

(65) Prior Publication Data

US 2025/0358563 A1     Nov. 20, 2025

Related U.S. Application Data

(60) Provisional application No. 63/648,748, filed on May 17, 2024.

(51) Int. Cl.
| | |
|---|---|
| H04R 1/28 | (2006.01) |
| B81B 7/00 | (2006.01) |
| H04R 1/02 | (2006.01) |
| H04R 1/06 | (2006.01) |
| H04R 7/04 | (2006.01) |
| H04R 9/02 | (2006.01) |
| H04R 9/04 | (2006.01) |
| H04R 9/06 | (2006.01) |
| H04R 31/00 | (2006.01) |

(52) U.S. Cl.
CPC ......... *H04R 1/2803* (2013.01); *B81B 7/0061* (2013.01); *H04R 1/023* (2013.01); *H04R 9/045* (2013.01); *H04R 9/046* (2013.01); *B81B 2201/0257* (2013.01); *B81B 2203/0127* (2013.01)

(58) Field of Classification Search
USPC ......... 381/87, 332, 150, 345, 347, 348, 353, 381/189, 190, 191, 396, 124
See application file for complete search history.

(56) References Cited

U.S. PATENT DOCUMENTS

| | | | | |
|---|---|---|---|---|
| 2010/0002894 A1* | 1/2010 | Lan | | H04R 31/00 |
| | | | | 381/163 |
| 2018/0302724 A1* | 10/2018 | Li | | H04R 1/06 |
| 2018/0376248 A1* | 12/2018 | Yuen | | H04R 1/2826 |
| 2021/0185449 A1* | 6/2021 | Kim | | H04R 1/086 |
| 2022/0141595 A1* | 5/2022 | Chen | | H04R 9/06 |
| | | | | 381/19 |
| 2023/0368765 A1* | 11/2023 | Zhang | | H04R 1/021 |
| 2025/0330744 A1* | 10/2025 | Robison | | H04R 1/2849 |

* cited by examiner

*Primary Examiner* — Qin Zhu
(74) *Attorney, Agent, or Firm* — McClure, Qualey & Rodack, LLP

(57)     ABSTRACT
A micro speaker structure is provided. The micro speaker structure includes a substrate, a diaphragm, a coil, a circuit board, and at least one acoustic mesh. The substrate has a hollow chamber. The diaphragm is disposed over the substrate and covers the hollow chamber. The coil is embedded in the diaphragm. The circuit board is attached to the substrate, wherein at least one vent hole passes through the top surface and the bottom surface of the circuit board. The acoustic mesh is disposed on the bottom surface of the circuit board to cover the vent hole. The acoustic mesh has a plurality of pores to allow sound to pass through, and the pores are smaller than the vent hole.

19 Claims, 16 Drawing Sheets

MICRO SPEAKER STRUCTURE WITH ACOUSTIC MESH

CROSS REFERENCE TO RELATED APPLICATIONS

This application claims the benefit of U.S. Provisional Application No. 63/648,748, filed on May 17, 2024, the entirety of which is incorporated by reference herein.

BACKGROUND OF THE INVENTION

Field of the Invention

The invention relates in general to a micro speaker structure, and in particular to a micro speaker structure with an acoustic mesh.

Description of the Related Art

Since electronic products are becoming smaller and thinner, how to scale down the size of electronic products has become an important topic. Micro electromechanical system (MEMS) technology is a technology that combines semiconductor processing and mechanical engineering, which can effectively reduce the size of components and produce multi-functional micro elements and micro systems.

The manufacturing of traditional moving coil speakers has become quite mature, but the traditional moving coil speakers have a large size and take up much space. If a MEMS process is used to manufacture a moving coil speaker on a semiconductor chip, the size and volume will be reduced. However, in addition to the need to reduce the size to facilitate manufacturing, it is still necessary to develop a micro speaker with better performance. For example, recently, the requirements for the sound pressure level (SPL) performance of micro speakers in the ultra-high frequency bands (e.g., above 20 kHz) have become increasingly higher.

BRIEF SUMMARY OF THE INVENTION

An embodiment of the invention provides a micro speaker structure as a tweeter. The micro speaker structure includes a substrate, a diaphragm, a coil, a circuit board, and at least one acoustic mesh. The substrate has a hollow chamber. The diaphragm is disposed over the substrate and covers the hollow chamber. The coil is embedded in the diaphragm. The circuit board is attached to the substrate, wherein at least one vent hole passes through the top surface and the bottom surface of the circuit board. The acoustic mesh is disposed on the bottom surface of the circuit board to cover the vent hole. The acoustic mesh has a plurality of pores to allow sound to pass through, and the pores are smaller than the vent hole.

In some embodiments, the size of each pore is greater than 0.1 μm and less than 20 μm.

In some embodiments, the average open area percentage of the pores is greater than 0.1% and less than 20%.

In some embodiments, the at least one acoustic mesh includes a plurality of acoustic meshes, and the acoustic meshes are stacked on top of each other on the bottom surface of the circuit board.

In some embodiments, the acoustic meshes have the same pore size and the same average open area percentage.

In some embodiments, the acoustic meshes have different pore sizes and different average open area percentages.

In some embodiments, the at least one acoustic mesh includes a plurality of acoustic meshes, and the acoustic meshes are arranged side by side on the bottom surface of the circuit board.

In some embodiments, the acoustic meshes have different pore sizes and different average open area percentages.

In some embodiments, the micro speaker structure further includes a first permanent magnetic element disposed on the top surface of the circuit board and in the hollow chamber.

In some embodiments, the circuit board has a cavity recessed from the top surface of the circuit board, wherein the cavity is configured to accommodate the first permanent magnetic element.

In some embodiments, the at least one vent hole includes a plurality of vent holes, and the vent holes are disposed around the first permanent magnetic element.

In some embodiments, the micro speaker structure further includes a lid wrapped around the substrate and the diaphragm, wherein the lid has an air opening that exposes a portion of the top surface of the diaphragm.

In some embodiments, the lid is made of a metal material having a magnetic permeability that is lower than $1.25 \times 10^{-4}$ H/m.

In some embodiments, the micro speaker structure further includes a second permanent magnetic element disposed on the lid, wherein the second permanent magnetic element is located below or above the air opening.

In some embodiments, the coil includes a first metal layer and a second metal layer, wherein the first metal layer has a spiral structure surrounding the central axis of the diaphragm, and the second metal layer crosses over the spiral structure of the first metal layer and is electrically connected to the first metal layer.

Another embodiment of the invention provides a micro speaker structure. The micro speaker structure includes a substrate, a diaphragm, a coil, a circuit board, at least one acoustic mesh, and a lid. The substrate has a hollow chamber. The diaphragm is disposed over the substrate and covers the hollow chamber. The coil is embedded in the diaphragm. The circuit board is attached to the substrate and has at least one vent hole, wherein the vent hole is configured to allow the hollow chamber to communicate with the external environment. The acoustic mesh is disposed on the surface of the circuit board to cover the vent hole, wherein the acoustic mesh has a plurality of pores to allow sound to pass through. The size of each pore is greater than 0.1 μm and less than 20 μm. The lid is wrapped around the substrate and the diaphragm, wherein the lid has an air opening that exposes a portion of the top surface of the diaphragm.

In some embodiments, the average open area percentage of the pores is greater than 0.1% and less than 20%.

In some embodiments, the micro speaker structure further includes a first permanent magnetic element disposed on the circuit board and in the hollow chamber, and a second permanent magnetic element disposed on the lid, wherein the first permanent magnetic element and the second permanent magnetic element are aligned in the vertical direction.

In some embodiments, the acoustic mesh is disposed on the surface of the circuit board opposite the lid.

Another embodiment of the invention provides a micro speaker structure. The micro speaker structure includes a substrate, a diaphragm, a coil, a circuit board, a permanent magnetic element, at least one acoustic mesh, and a lid. The substrate has a hollow chamber. The diaphragm is disposed over the substrate and covers the hollow chamber. The coil is embedded in the diaphragm. The circuit board is attached to the substrate and has at least one vent hole, wherein the vent hole is configured to allow the hollow chamber to communicate with the external environment. The permanent magnetic element is disposed on the top surface of the circuit board facing the diaphragm and in the hollow chamber. The circuit board further has a cavity recessed from the top surface of the circuit board for accommodating the permanent magnetic element. The acoustic mesh is disposed on the surface of the circuit board to cover the vent hole, wherein the acoustic mesh has a plurality of pores to allow sound to pass through. The size of each pore is greater than 0.1 µm and less than 20 µm. The lid is wrapped around the substrate and the diaphragm, wherein the lid has an air opening that exposes a portion of the top surface of the diaphragm.

BRIEF DESCRIPTION OF DRAWINGS

Aspects of this disclosure are best understood from the following detailed description when read with the accompanying figures. It should be noted that, in accordance with common practice in the industry, various features are not drawn to scale. In fact, the dimensions of the various features may be arbitrarily increased or reduced for clarity of discussion.

DETAILED DESCRIPTION OF INVENTION

Figure 1:
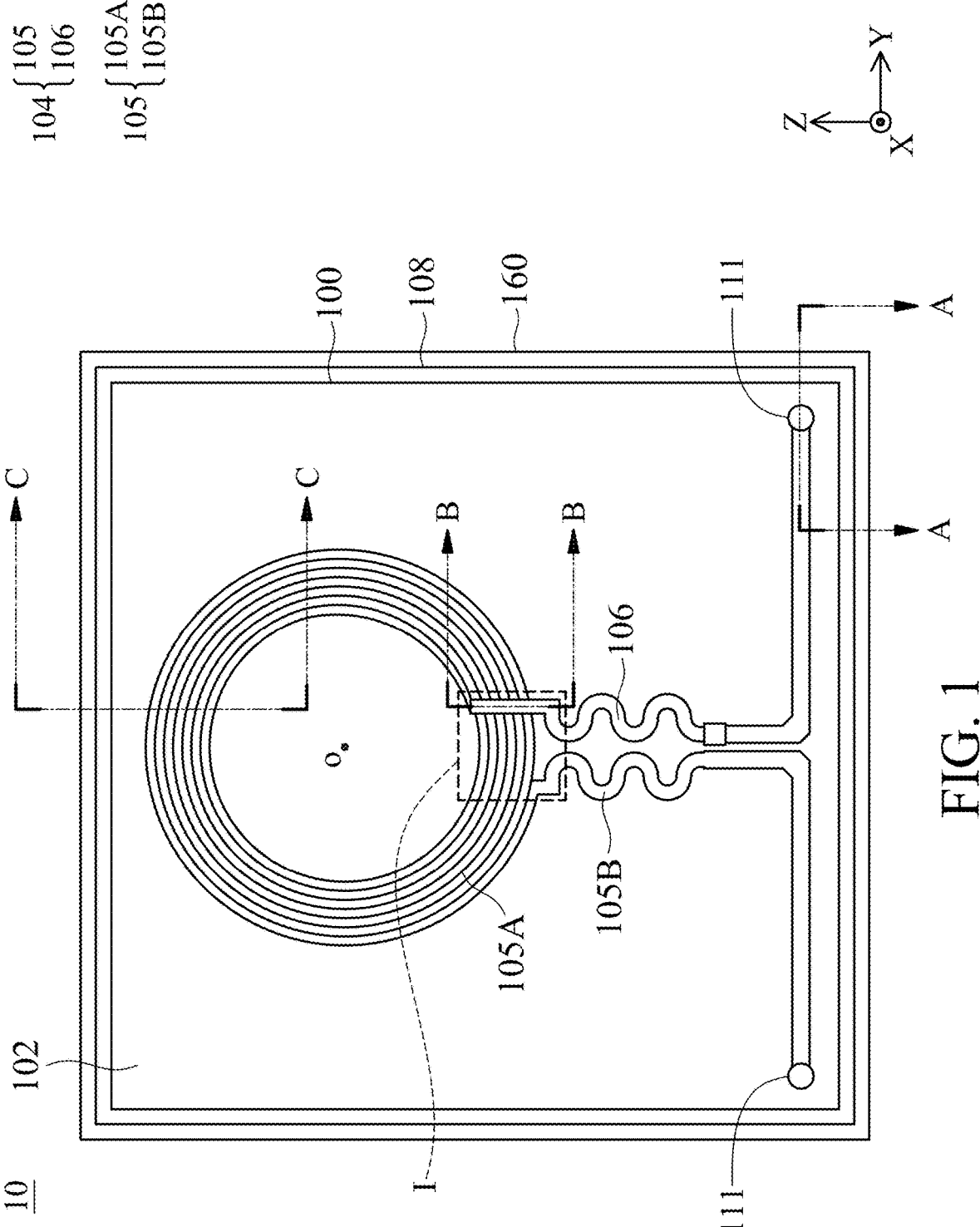
FIG. 1 illustrates a top view of a micro speaker structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device (or structure) in use or operation in addition to the orientation depicted in the figures. The device may be otherwise oriented (rotated 90 degrees or at other orientations) and the spatially relative descriptors used herein may likewise be interpreted accordingly.

When a number or a range of numbers is described with "about," "approximate," and the like, the term is intended to encompass numbers that are within a reasonable range including the number described, such as within +/−10% of the number described or other values as understood by person skilled in the art. For example, the term "about 5 µm" encompasses the dimension range from 4.5 µm to 5.5 µm.

Furthermore, the use of ordinal terms such as "first", "second", "third", etc., in the disclosure to modify an element does not by itself connote any priority, precedence, or order of one claim element over another or the temporal order in which it is formed, but are used merely as labels to distinguish one claim element having a certain name from another element having the same name (but for use of the ordinal term) to distinguish the claim elements.

Unless defined otherwise, all terms (including technical and scientific terms) used herein have the same meaning as commonly understood to one of ordinary skill in the art to which this invention belongs. It should be appreciated that each term, which is defined in a commonly used dictionary, should be interpreted as having a meaning conforming to the relative skills and the background or the context of the present disclosure, and should not be interpreted in an idealized or overly formal manner unless defined otherwise. For example, the term "permanent magnetic element" used in the present disclosure refers to an element that can maintain magnetism for a long time. That is, the permanent magnetic element is not easy to lose magnetism and is not easy to be magnetized. In addition, permanent magnetic elements can also be referred to as "hard magnetic elements."

Micro speaker structures are provided in accordance with some embodiments of the present disclosure, wherein the back side of a carrier board (e.g., a printed circuit board) is provided with at least one acoustic mesh to cover the vent holes within the carrier board to reduce the sound pressure level (SPL) drop at ultra-high frequencies (e.g., above 20 kHz), which will be described in more detail below. Accordingly, the embodiment micro speaker structures (such as tweeters) have improved SPL performance in the ultra-high frequency bands.

FIG. 1 is a top view illustrating a micro speaker structure 10, in accordance with some embodiments. The micro speaker structure 10 is an electroacoustic transducer, such as a micro moving coil speaker, and may be disposed in general electronic products. As shown in FIG. 1, the micro speaker structure 10 includes a substrate 100, a diaphragm 102, a (multi-layered) coil 104, a lid 108, and a carrier board 160. It should be noted that in the example of FIG. 1, in order to show the internal structure of the micro speaker structure 10, the diaphragm 102 and the lid 108 are only represented by rectangles.

Figure 2:
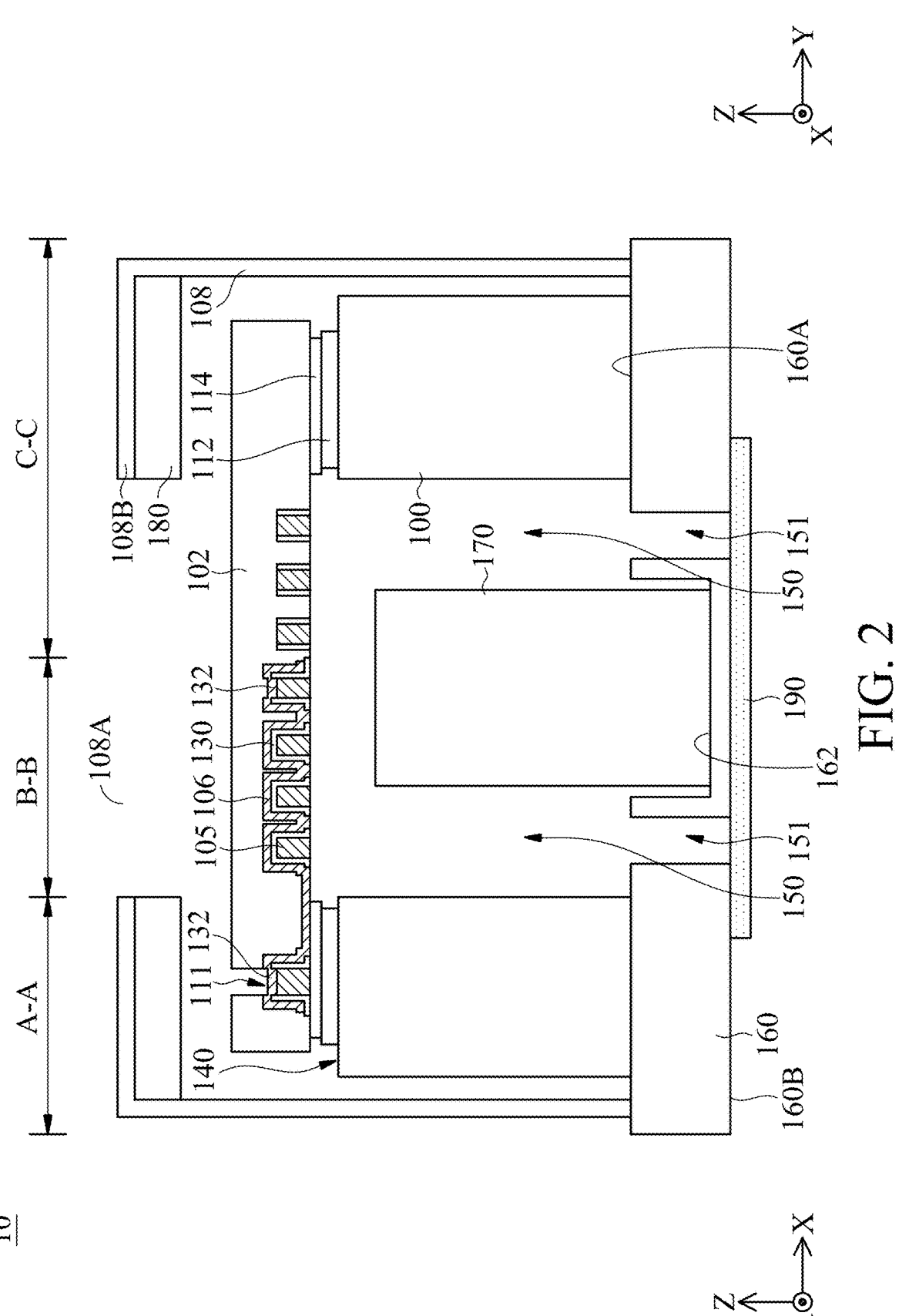
FIG. 2 illustrates a cross-sectional view of the micro speaker structure shown in FIG. 1, in accordance with some embodiments.

FIG. 2 illustrates a cross-sectional view of the micro speaker structure 10 shown in FIG. 1, in accordance with some embodiments. Referring to FIGS. 1 and 2, the diaphragm 102 is disposed above the substrate 100 and can deform (e.g., oscillate) in the normal direction of the substrate 100 (e.g., the Z-axis direction). The coil 104 is embedded in the diaphragm 102, which means that the coil 104 is not exposed. The coil 104 is configured to transmit electric signals, and drives the diaphragm 102 to deform relative to the substrate 100 according to the electric signals. At present, resistances of speakers are mostly 8Ω or 32Ω, which is lower than that of single-layer coils. The multi-layered coils of the present disclosure can easily meet the resistance requirements.

The multi-layered coil 104 includes a first metal layer 105 and a second metal layer 106. The first metal layer 105 is electrically connected to the second metal layer 106 in one opening 111 of the diaphragm 102 to transmit electrical signals from a control unit (not shown) for controlling the operation of the micro speaker structure 10. In some embodiments, the first metal layer 105 includes a spiral structure 105A located in the center of the diaphragm 102 and a wavy structure 105B extending from the spiral structure 105A to the periphery of the diaphragm 102. The spiral structure 105A is disposed around the central axis O of the diaphragm 102, and the wavy structure 105B connects the spiral structure 105A to the opening 111. By providing the wavy structure 105B, the diaphragm 102 can be more flexible, and the difficulty of the oscillation can be reduced. In some cases, the second metal layer 106 may also include a wavy structure.

Figure 3:
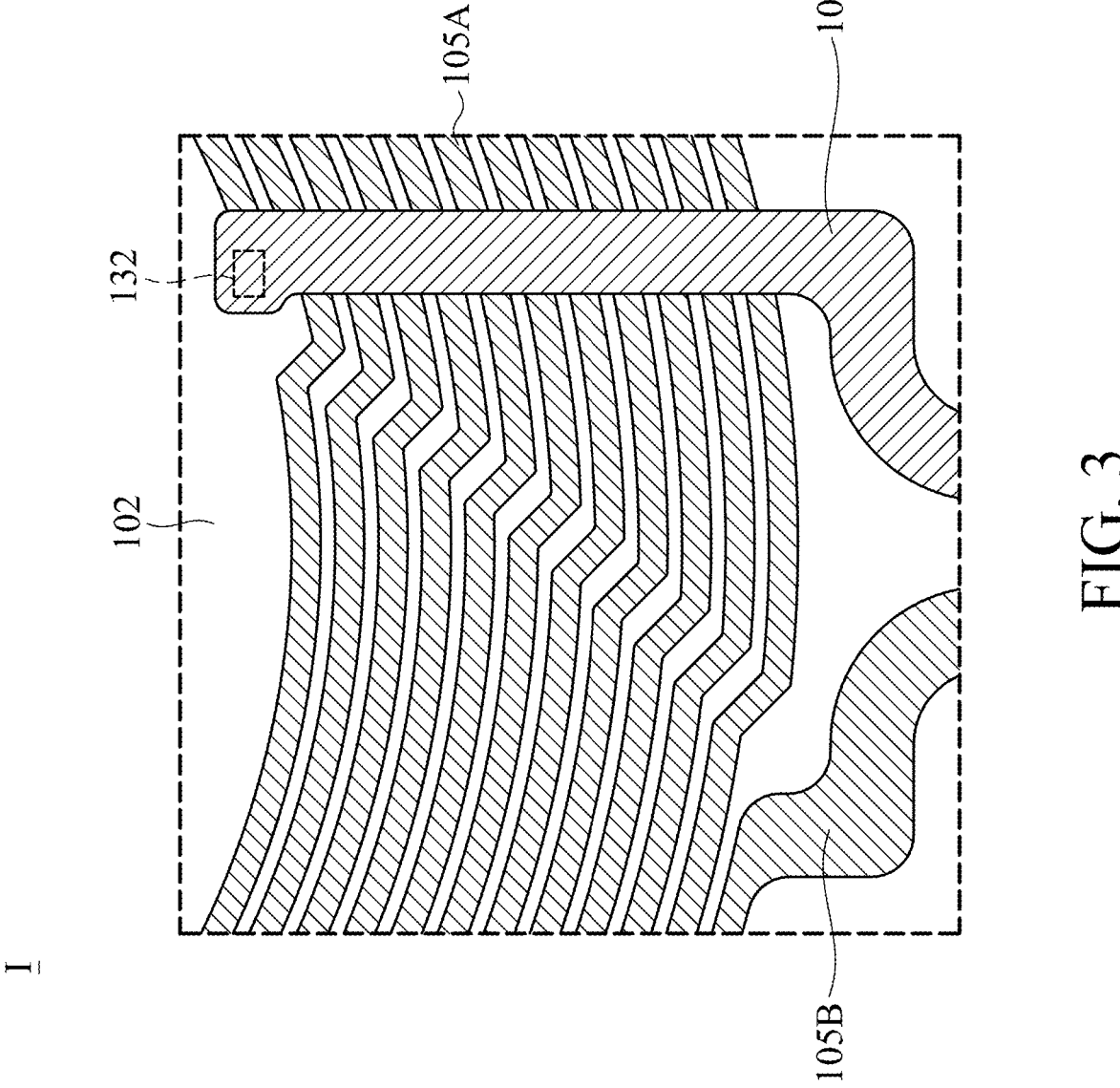
FIG. 3 illustrates an enlarged view of the area I shown in FIG. 1, in accordance with some embodiments.

FIG. 3 illustrates an enlarged view of the area I shown in FIG. 1, in accordance with some embodiments. Referring to FIGS. 2 and 3, the first metal layer 105 and the second metal layer 106 are located on different horizontal planes parallel to the X-Y plane, and the second metal layer 106 is higher than the first metal layer 105. That is, the second metal layer 106 is closer to the top of the diaphragm 102 than the first metal layer 105. A dielectric layer 130 is disposed between the first metal layer 105 and the second metal layer 106 to prevent a short circuit between the first metal layer 105 and the second metal layer 106. A conductive via 132 is formed in the dielectric layer 130. The second metal layer 106 crosses over the spiral structure 105A and is electrically connected to the first metal layer 105 through the conductive via 132.

In accordance with some embodiments, a first permanent magnetic element 170 is disposed below the diaphragm 102 and the second permanent magnetic element 180 is disposed above the diaphragm 102, as shown in FIG. 2. The first permanent magnetic element 170 and the second permanent magnetic element 180 can attract each other to improve the frequency response of the diaphragm 102. It should be noted that, in order to simplify the figure, FIG. 1 does not show the first permanent magnetic element 170 or the second permanent magnetic element 180.

Still referring to FIG. 2, the carrier board 160 (e.g., a printed circuit board (PCB)) has vent holes 151 that allow the interior space of the micro speaker structure 10 (including a back side hollow chamber 150 between the diaphragm 102 and the carrier board 160 and a front side chamber between the diaphragm 102 and the lid 108) to communicate with the external environment. The lid 108 is disposed on the carrier board 160 and wraps around the various components mentioned above for protection. The lid 108 has an air opening 108A to allow air to exit the micro speaker structure 10, thereby producing sound. The specific appearance of the micro speaker structure 10 according to some embodiments may be referred to FIGS. 4A and 4B.

As mentioned above, at present, the market has increasingly higher requirements for the SPL performance of micro speakers (such as tweeters) in the ultra-high frequency bands (e.g., above 20 kHz). It has been found that there is a significant SPL drop between approximately 20 kHz and 40 kHz (see, for example, FIG. 9), which is caused by the Helmholtz resonance occurring at the back side hollow chamber 150.

Figures 4A, 4B:
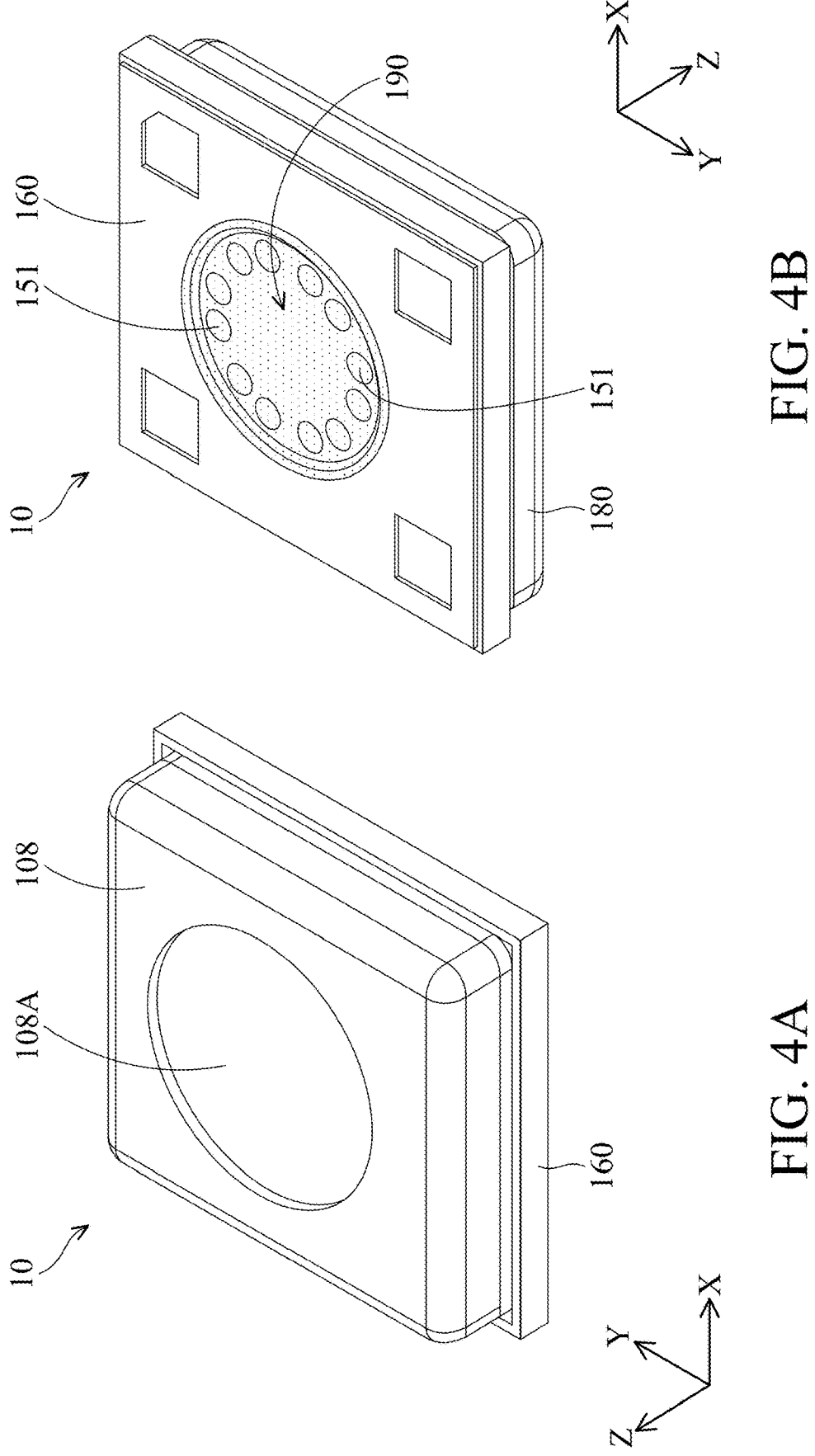
FIGS. 4A and 4B illustrate front and rear perspective views of the micro speaker structure shown in FIGS. 1 and 2, in accordance with some embodiments.
Figure 9:
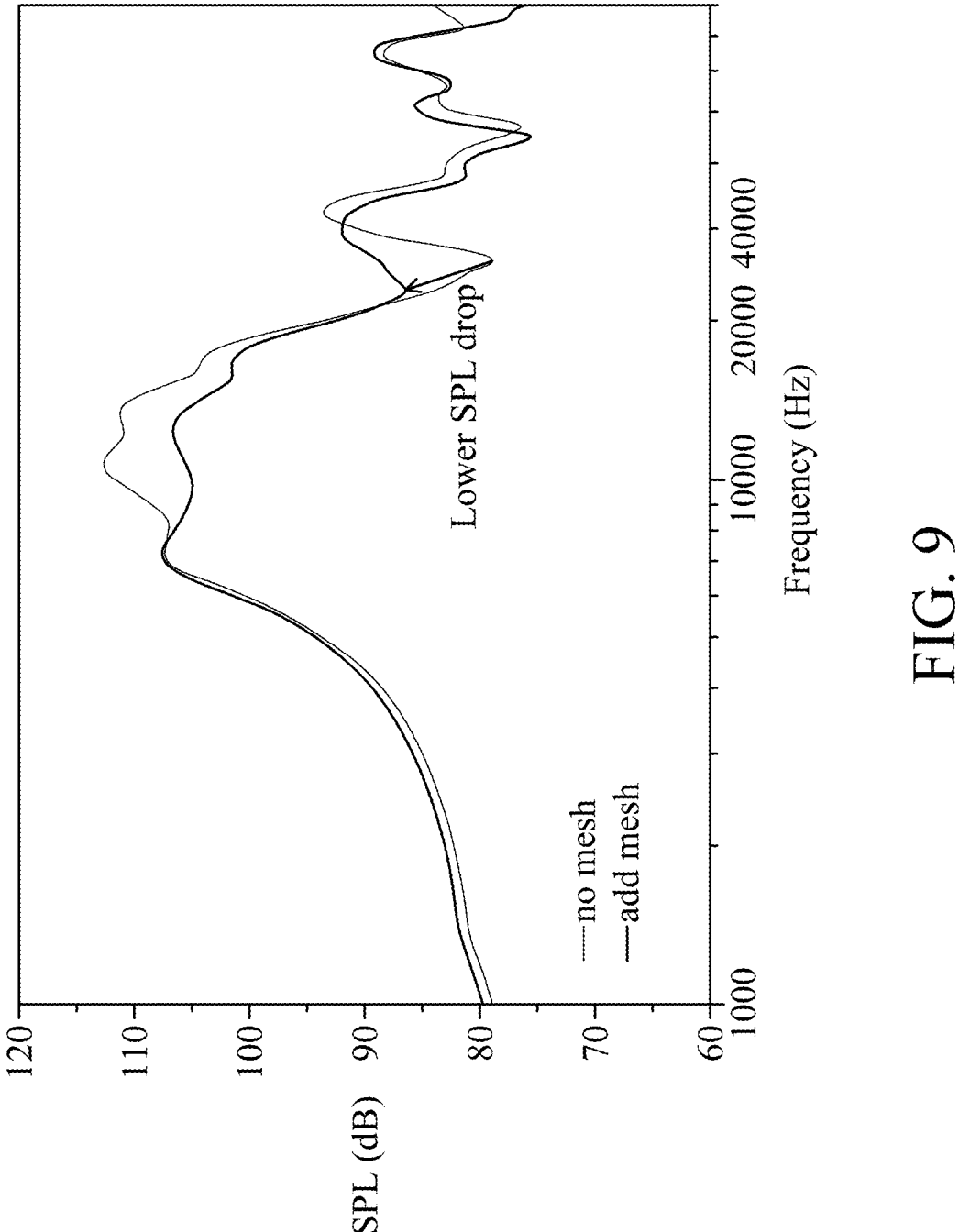
FIG. 9 is a graph showing the relationship between frequency and sound pressure level (SPL) for micro speaker structures with and without an acoustic mesh.

To address this, the micro speaker structure 10 according to some embodiments further includes an acoustic mesh 190 disposed on the back side 160B of the carrier board 160 to cover the vent holes 151, as shown in FIGS. 2 and 4B. The acoustic mesh 190 may include a plurality of pores (not specifically shown) so as to not block air or sound, but the pores of the acoustic mesh 190 may be relatively smaller than the vent holes 151 of the carrier board 160, such as less than 20 micrometers (μm) in diameter. Therefore, installing the acoustic mesh 190 is equivalent to making the carrier board 160 have smaller vent holes, thereby reducing the resonant frequency of the back side hollow chamber 150. As a result, the SPL curve increases (i.e., lower SPL drop) in the ultra-high frequency bands such as 20 KHz to 40 KHz, as shown in FIG. 9. In other words, the micro speaker structures 10 including the acoustic mesh 190 achieve improved SPL performance in the ultra-high frequency bands.

The detailed structure and formation method of the micro speaker structure 10 will be discussed as follows in accompany with FIGS. 5A to 5G.

FIGS. 5A-5G illustrate cross-sectional views of intermediate stages in the formation of the micro speaker structure 10 shown in FIG. 1, in accordance with some embodiments. It should be understood that each of the figures includes cross-sectional views along lines A-A, B-B, and C-C shown in FIG. 1. In this way, the fabrication processes of different parts of the micro speaker structure 10 can be shown in a single figure. Two sets of coordinate axes are provided in FIGS. 3A-3E, wherein one set of coordinate axes in the left-hand side correspond the cross-sectional view along line A-A, and the other set of coordinate axes in the right-hand side correspond the cross-sectional views along lines B-B and C-C.

Figure 5A:
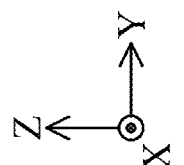
FIGS. 5A to 5G illustrate cross-sectional views of intermediate stages in the formation of the micro speaker structure shown in FIG. 1, in accordance with some embodiments.
Figure 5A:
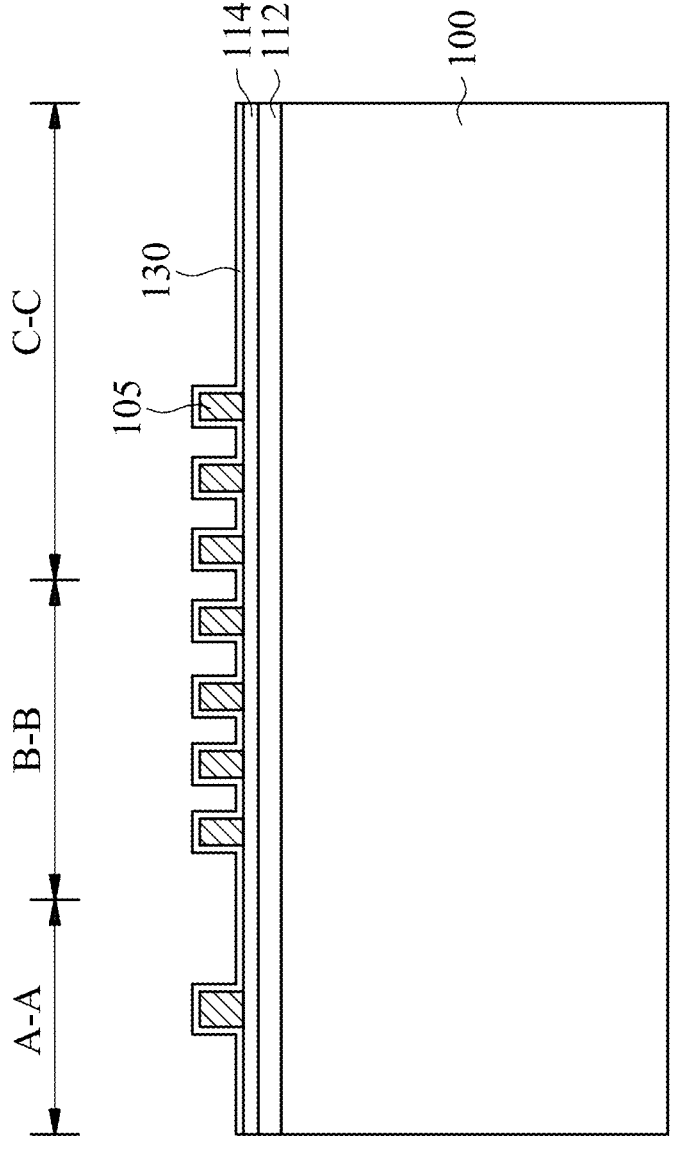
Figure 5A:
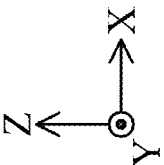

Referring to FIG. 5A, a substrate 100 is provided. In some embodiments, the substrate 100 is part of a semiconductor wafer, and may be formed of silicon (Si). Alternatively, the substrate 100 may include other semiconductor materials, such as germanium; a compound semiconductor including silicon carbide (SiC), gallium arsenic (GaAs), gallium phosphide (GaP), gallium nitride (GaN), indium phosphide (InP), and/or indium arsenide (InAs); an alloy semiconductor including SiGe, SiGeC, GaAsP, GaInAs, and/or InGaP; or combinations thereof. In some embodiments, the thickness (e.g., in the Z-axis direction) of the substrate 100 may be between about 100 μm and about 1000 μm.

Two dielectric or insulating layers 112, 114 are formed on the substrate 100, wherein the insulating layer 112 is disposed between the insulating layer 114 and the substrate 100. Each of the insulating layers 112 and 114 is made of or includes silicon dioxide ($SiO_2$) or another suitable insulating material, and may be formed by thermal oxidation, chemical vapor deposition (CVD), low pressure CVD (LPCVD), atmospheric pressure CVD (APCVD), plasma-enhanced CVD (PECVD), or any other suitable process.

The first metal layer 105 of the multi-layered coil 104 is formed on the insulating layer 114 using electroplating or other deposition processes such as physical vapor deposition (PVD), sputtering or evaporation. The material of the first metal layer 105 includes aluminum silicon alloy, aluminum, copper, or any other suitable conductive material. A patterning process (e.g., including a photolithography process and/or an etching process) is then performed on the first metal layer 105, generating the spiral structure 105A and the wavy structure 105B shown in FIG. 1. In some embodiments, the line width of the first metal layer 105 may be between 1 μm and 500 μm, and the thickness (e.g., in the Z-axis direction) of the first metal layer 105 may be between 0.1 μm and 20 μm.

Subsequently, a dielectric layer 130 is conformally formed on the patterned first metal layer 105 and the insulating layer 114 by furnace process, CVD or another suitable deposition process. The dielectric layer 130 may be a carbon-doped oxide or any other suitable insulating material.

Figure 5B:
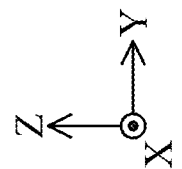
Figure 5B:
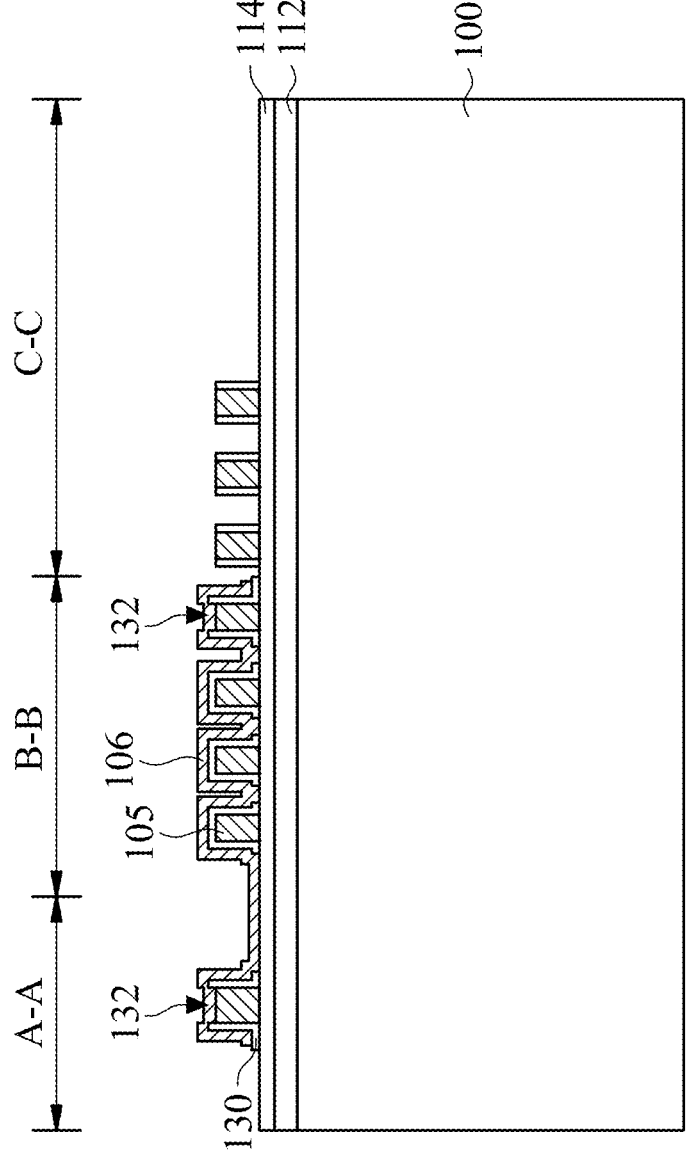
Figure 5B:
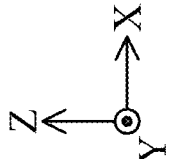
Figure 5C:
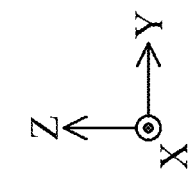
Figure 5C:
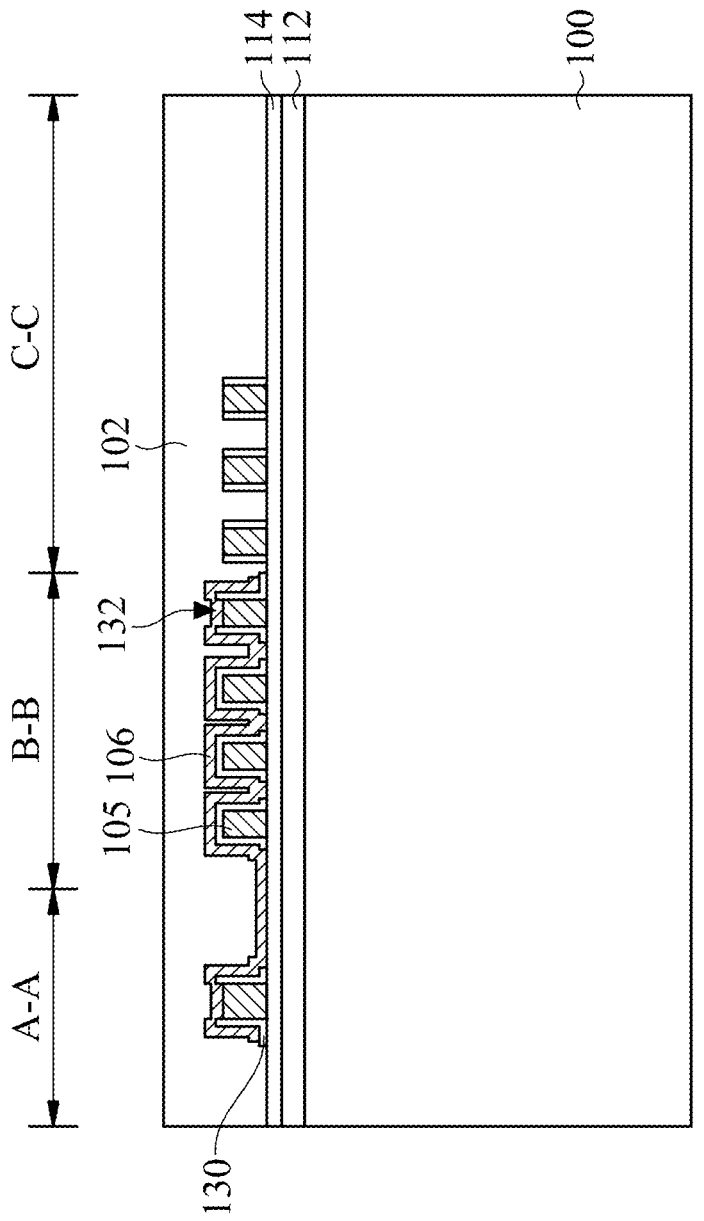
Figure 5C:
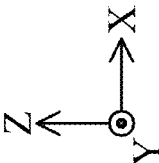

Next, in FIG. 5B, the dielectric layer 130 is patterned (e.g., through a photolithography process and/or an etching process) to form through holes in the dielectric layer 130 to expose the underlying first metal layer 105. The second metal layer 106 of the multi-layered coil 104 is then formed on the dielectric layer 130 and the first metal layer 105 using electroplating or other deposition processes such as PVD, sputtering or evaporation. The material of the second metal layer 106 includes aluminum silicon alloy, aluminum, copper, or any other suitable conductive material. A patterning process (e.g., including a photolithography process and/or an etching process) is then performed on the second metal layer 106, leaving portions located on the dielectric layer 130 or in the through holes (thereby forming the conductive vias 132). In some embodiments, the line width of the second metal layer 106 may be between 1 μm and 500 μm, and the thickness of the second metal layer 106 may be between 0.1 μm and 20 μm.

It should be noted that the patterned dielectric layer 130 only leaves a portion required to electrically insulate the first metal layer 105 and the second metal layer 106. By removing undesired portions of the dielectric layer 130, the diaphragm 102 (see FIG. 5C) can be more flexible, thereby improving the performance of the micro speaker structure 10. Next, in FIG. 5C, a diaphragm 102 is formed over the above-mentioned structures such that the multi-layered coil 104 (including the first metal layer 105 and the second metal layer 106) and the dielectric layer 130 are embedded in the diaphragm 102 (i.e., they are not exposed). The diaphragm 102 may be formed by spin coating or any other suitable process. In some embodiments, the diaphragm 102 is made of or includes polydimethylsiloxane (PDMS), phenolic epoxy resin (such as SU-8), polyimide (PI), or a combination thereof. In an example, the diaphragm 102 is formed of PDMS, and the Young's modulus of the diaphragm 102 is in a range between about 1 MPa and about 100 GPa. Compared with a diaphragm formed of polyimide, the diaphragm 102 formed of PDMS has a smaller Young's modulus and a softer film structure, which makes the diaphragm 102 have a larger displacement, thereby generating a larger sound amplitude.

Figure 5D:
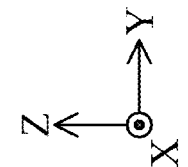
Figure 5D:
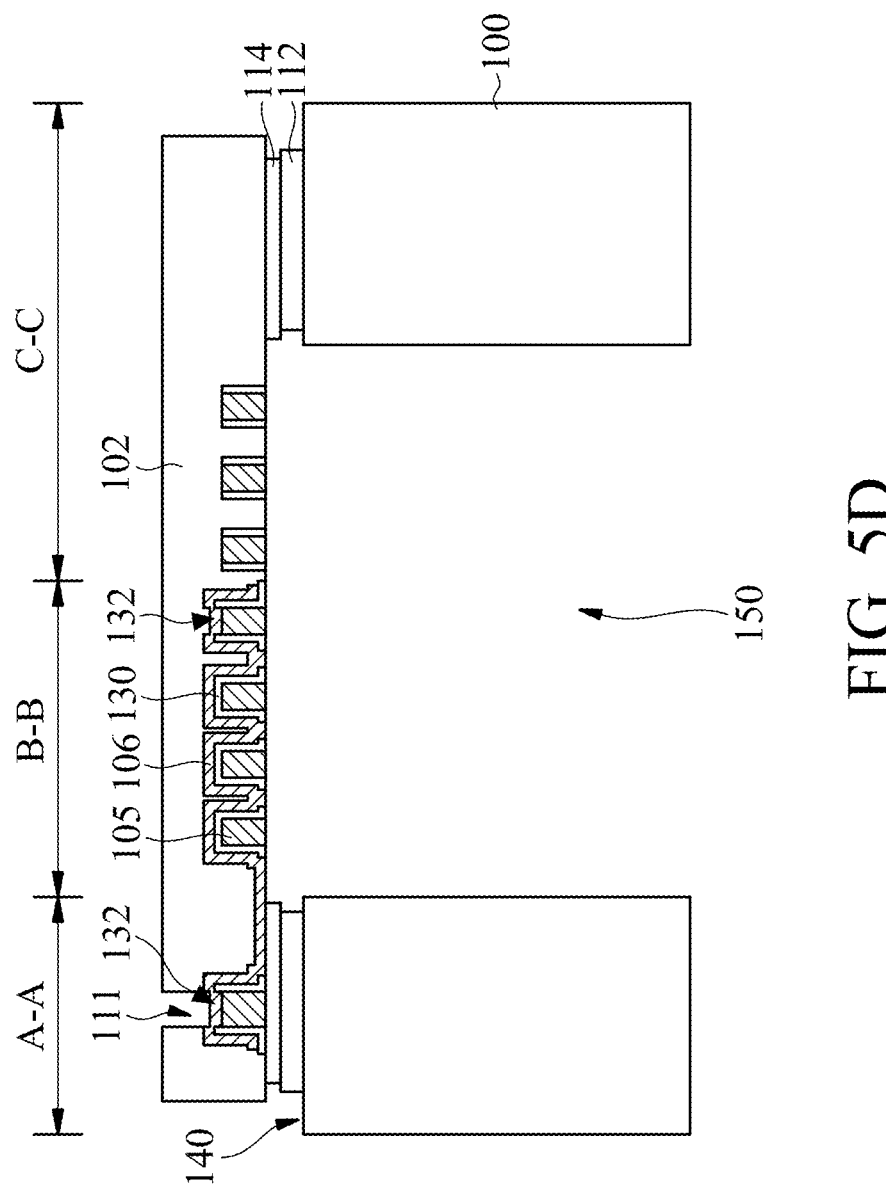
Figure 5D:
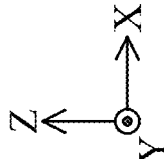

Next, in FIG. 5D, the diaphragm 102 is then patterned to form openings 111 (only one opening 111 is shown) in the diaphragm 102 and a cutting groove 140 surrounding the diaphragm 102. In some embodiments where the diaphragm 102 is made of a photosensitive material such as a photosensitive polymer material, the openings 111 and the cutting groove 140 may be formed by using photolithography and etching techniques. In other embodiments where the diaphragm 102 is made of a non-photosensitive material, the openings 111 and the cutting groove 140 may be formed by using drilling, cutting, and/or other suitable patterning techniques. The openings 111 may expose the underlying second metal layer 106 such that the first metal layer 105 is electrically connected to the second metal layer 106 in one of the openings 111 (as mentioned above). In other words, when viewed along the vertical direction (e.g., the Z-axis direction), one of the openings 111 of the diaphragm 102 and one of the conductive vias 132 may overlap. The cutting groove 140 may facilitate cutting process to separate the micro speaker structures 10

Still referring to FIG. 5D, a deep reactive-ion etching process or an etching process which applies an etchant (such as ammonium hydroxide (NH4OH), hydrofluoric acid (HF), deionized water, tetramethylammonium hydroxide (TMAH), potassium hydroxide (KOH)) is performed on the bottom surface of the substrate 100 to form a hollow chamber 150 in the substrate 100. The diaphragm 102 covers (e.g., is suspended over) the hollow chamber 150 after the etching process. It should be noted that the insulating layers 112 and 114 may act as etch stop layers during the etching process, thereby protecting the diaphragm 102 and the multi-layered coil 104 from being etched.

Figure 5E:
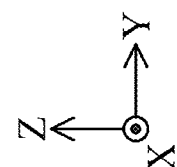
Figure 5E:
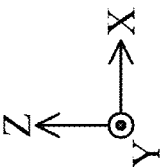

Next, in FIG. 5E, a carrier board 160 (such as a PCB) is disposed on or attached to the bottom surface of the substrate 100. Therefore, the substrate 100 is located between the carrier board 160 and the diaphragm 102. As mentioned above, the carrier board 160 has one or more vent holes 151, which allow the hollow chamber 150 to communicate with the external environment. The vent holes 151 may have circular, oval or any other suitable cross-sectional shape.

In addition, a first permanent magnetic element 170 is disposed on the carrier board 160 and in the hollow chamber 150. The first permanent magnetic element 170 is used to cooperate with the overlying multi-layered coil 104 (i.e., the magnetic field generated by the first permanent magnetic element 170 interacts with a current passing through the multi-layered coil 104) to generate a (Lorentz) force (e.g., Z-axis force) in the normal direction of the diaphragm 102 (i.e., the vertical/Z-axis direction, which is perpendicular to its top surface), and the diaphragm 102 can vibrate/oscillate relative to the substrate 100 due to the force to generate sound. In some embodiments, the first permanent magnetic element 170 may include a neodymium iron boron magnet.

In some embodiments, the vent holes 151 are disposed around the (cylindrical) first permanent magnetic element 170 and located within the hollow space 150 in a plan view (e.g., top view). There can be any number of vent holes 151 (see, for example, FIGS. 7A to 7F). In general, more vent holes 151 can improve the SPL performance in the high-frequency (e.g., above 1 KHz).

In some embodiments, the carrier board 160 may have a cavity 162 recessed from its top surface 160A for accommodating the first permanent magnetic element 170, as shown in FIG. 5E. This allows the use of a larger (e.g., thicker) magnet (i.e., first permanent magnetic element 170), which can generate larger Lorentz forces. Therefore, the performance (e.g., SPL) of the micro speaker structure 10 is improved.

Figure 5F:
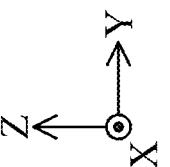

Next, in FIG. 5F, a lid 108 is disposed on the carrier board 160 and wraps around the substrate 100 and the diaphragm 102. The lid 108 has an air opening 108A that exposes a portion of the top surface of the diaphragm 102 to allow air to exit the micro speaker structure 10, thereby producing sound. In some embodiments, the lid 108 may include metals with magnetic permeability that is lower than 1.25× $10^{-4}$H/mm such as gold (Au), copper (Cu), aluminum (Al), or a combination thereof.

Still referring to FIG. 5F, a second permanent magnetic element 180 is disposed above the diaphragm 102. In some embodiments, the (annular) second permanent magnetic element 180 is disposed below an end 108B of the lid 108 surrounding the air opening 108A. The second permanent magnetic element 180 and the first permanent magnetic element 170 can attract each other to increase the deflection of the planar magnetic field. Therefore, the force generated by the current passing through the multilayer coil 104 and the planar magnetic field in the normal direction of the substrate 100 is increased, so that the diaphragm 102 has a better frequency response, thereby improving the performance of the micro speaker structure 10. In some embodiments, the second permanent magnetic element 180 may include a neodymium iron boron magnet.

In some embodiments, the (vertical) distance between the first permanent magnetic element 170 and the second permanent magnetic element 180 may be between 200 μm and 1000 μm. If the distance between the first permanent magnetic element 170 and the second permanent magnetic element 180 is greater than 1000 μm, there may not be sufficient attractive force between the two to increase the deflection of the planar magnetic field, resulting in a smaller frequency response of the micro speaker structure 10, thereby reducing the performance of the micro speaker structure 10. If the distance between the first permanent magnetic element 170 and the second permanent magnetic element 180 is less than 200 μm, when the diaphragm 102 deforms up and down relative to the substrate 100, it may repeatedly contact and strike the first permanent magnetic element 170 and the second permanent magnetic element 180, which causes damage to the micro speaker structure 10, thereby reducing the reliability of the micro speaker structure 10.

Figure 5G:
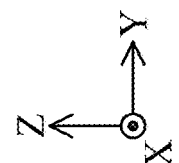

Next, in FIG. 5G, an acoustic mesh 190 is disposed on the back side (bottom surface) 160B of the carrier board 160 to cover the vent holes 151 (see also FIG. 4B). The acoustic mesh 190 may include materials such as fabric woven from plastic, metal, or natural fibers. An adhesive layer (not shown) may be provided to adhere the acoustic mesh 190 to the back side 160B of the carrier board 160. In some embodiments, a thickness (e.g., in the Z-axis direction) of the acoustic mesh 190 may be between about 1 millimeter (mm) and about 2.5 mm.

As mentioned above, the acoustic mesh 190 may include a plurality of pores (not specifically shown) so as to not block air or sound. The pores of the acoustic mesh 190 may be relatively smaller than the vent holes 151 of the carrier board 160, such as less than 20 micrometers (μ) in diameter. In some embodiments, the size (e.g., cross-sectional diameter in the X-Y plane) of the pores of the acoustic mesh 190 may be greater than 0.1 μm and less than 20 μm. Additionally or alternatively, the average open area percentage of the acoustic mesh 190 is greater than 0.1% and less than 20%. The average open area percentage of the acoustic mesh 190 can be obtained by dividing the total area of pores within the acoustic mesh 190 by the total area of the acoustic mesh 190. If the pore size is greater than 20 μm and/or the average open area percentage is greater than 20%, the acoustic mesh 190 will have almost no effect of tuning the resonant frequency (or even reducing the SPL drop). If the pore size is less than 0.1 μm and/or the average open area percentage is less than 0.1%, the acoustic mesh 190 will block the passage of air or sound.

It has been found that the smaller the pore size and/or average open area percentage of the acoustic mesh 190, the better the effect of reducing the SPL drop in the ultra-high frequency bands. Therefore, we can use different acoustic meshes 190 to adjust the frequency response curve of the micro speaker structure 10 (such as controlling the SPL drop depth in the ultra-high frequency bands).

After completing the formation processes shown in FIGS. 5A to 5G, the micro speaker structure 10 can be obtained.

Figure 6:
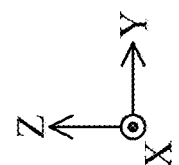
FIG. 6 illustrates a cross-sectional view of a micro speaker structure including multiple acoustic meshes, in accordance with some embodiments.

FIG. 6 illustrates a cross-sectional view of a micro speaker structure 10' including multiple acoustic meshes 190-1, 190-2, in accordance with some embodiments. The acoustic meshes 190-1 and 190-2 may be similar to the acoustic mesh 190 discussed above. In various embodiments, the acoustic meshes 190-1 and 190-2 may have the same pore size and the same average open area percentage, or may have different pore sizes and/or different same average open area percentages. By providing multiple acoustic meshes 190-1, 190-2 on the bottom side 160B (e.g., stacked on top of each other using adhesives) to cover the vent holes 151 of the carrier board 160, the SPL drop in the ultra-high frequency bands can be reduced even more (compared to providing a single acoustic mesh). Other features of the micro speaker structure 10' are similar to those of the micro speaker structure 10, and are not repeated here.

Figures 7A, 7B, 7C, 7D, 7E, 7F:
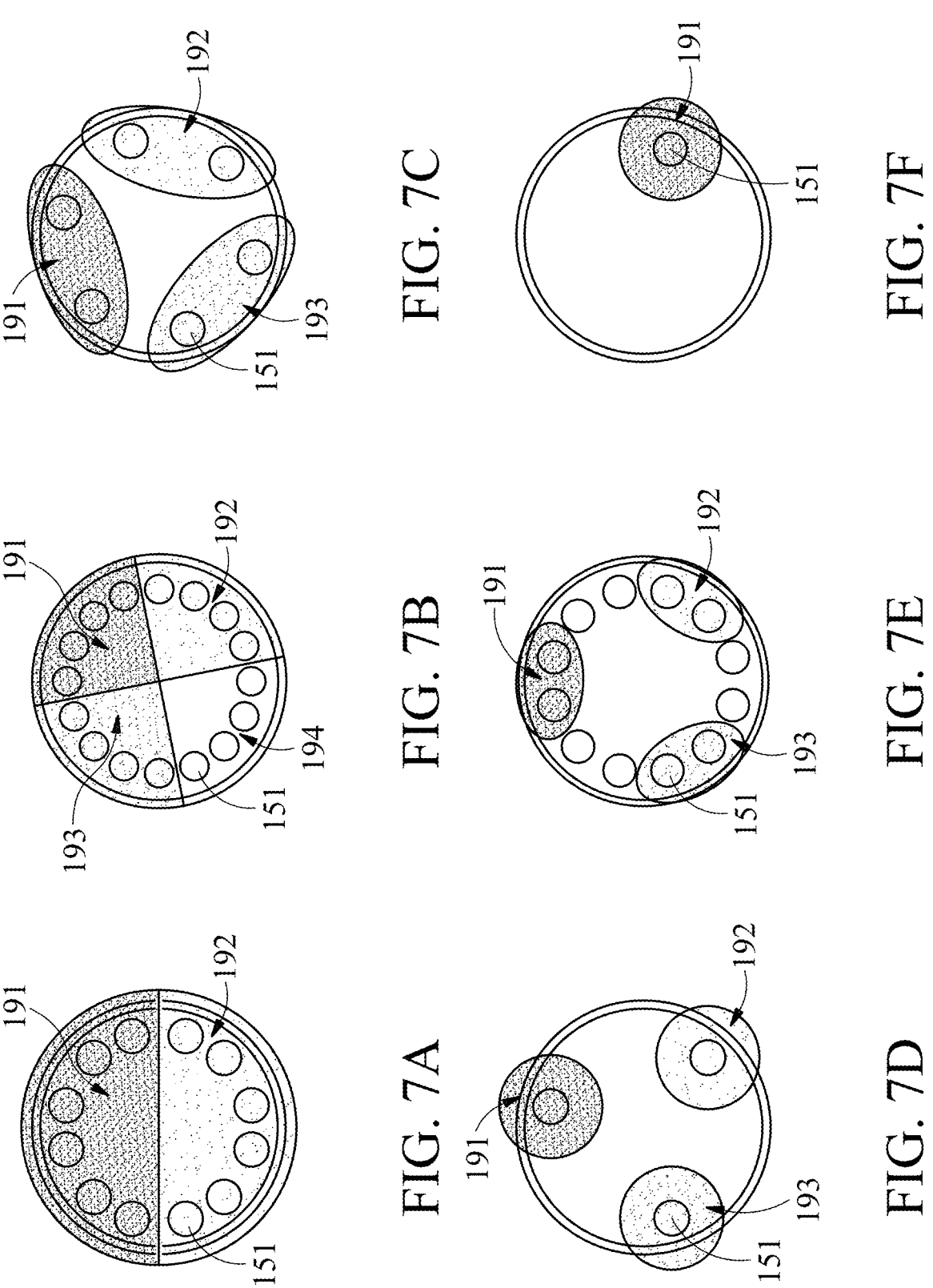
FIGS. 7A to 7F illustrate various arrangements of the acoustic mesh(es) and vent hole(s), in accordance with some embodiments.

FIGS. 7A to 7F illustrate various arrangements of the acoustic mesh(es) and vent hole(s), in accordance with some embodiments. In FIG. 7A, two semi-circular acoustic meshes 191 and 192 (whose pore sizes and average open area percentages may be the same or different) are arranged side by side (in the same horizontal plane), covering all vent holes 151 of the carrier board 160. In FIG. 7B, four quarter-circular acoustic meshes 191, 192, 193, and 194 (whose pore sizes and average open area percentages may be the same or different) are arranged side by side, covering all vent holes 151 of the carrier board 160. In FIG. 7C, three oval shaped acoustic meshes 191, 192, and 193 (whose pore sizes and average open area percentages may be the same or different) are provided to cover all vent holes 151, wherein each acoustic mesh corresponds to multiple (e.g., two) vent holes 151. In FIG. 7D, three circular acoustic meshes 191, 192, and 193 (whose pore sizes and average open area percentages may be the same or different) are provided to cover all vent holes 151, wherein each acoustic mesh corresponds to a vent hole 151. In FIG. 7E, some vent holes 151 are covered by the acoustic meshes 191, 192, and 193, while some vent holes 151 are exposed. In FIG. 7F, there is only one vent hole 151, which is coved by an acoustic mesh 191.

It should be understood that the configurations or arrangements of the acoustic mesh(es) and vent hole(s) shown in FIGS. 7A to 7F are illustrative examples only, and are not intended to be, and should not be construed to be, limiting to the present disclosure. Many alternatives and modifications will be apparent to those skilled in the art, once informed by the present disclosure.

Figure 8A:
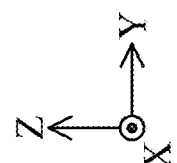
FIGS. 8A and 8B illustrate cross-sectional views of a micro speaker structure, in accordance with some embodiments.
Figure 8B:
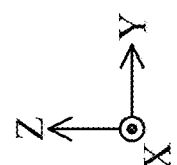

FIGS. 8A and 8B illustrate cross-sectional views of a micro speaker structure (10" or 10'''), in accordance with some embodiments. In FIGS. 8A and 8B, the lid 108 has an annular air opening 108A (instead of circular air opening 108A as shown in FIG. 5G), and the second permanent magnetic element 180 is mounted (e.g., fixed) on the top center portion of the lid 180 (either located below or above the top center portion). Accordingly, the second permanent magnetic element 180 and the first permanent magnetic element 170 are aligned in the vertical direction (e.g., the Z-axis direction). This helps generate greater Lorentz force, thereby improving the performance (e.g., SPL) of the micro speaker structure.

As described above, embodiments of the present disclosure provide a micro speaker structure with at least one acoustic mesh provided on the back side of the carrier board to cover the vent holes. With this configuration, the acoustic mesh can be used to adjust (e.g., lower) the resonant frequency of the back side chamber of the micro speaker structure, thereby reducing the SPL drop in the ultra-high frequency bands. Therefore, the micro speaker structures of the present disclosure have improved SPL performance in the ultra-high frequency bands.

The foregoing has outlined features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A micro speaker structure, comprising:
a substrate having a hollow chamber;
a diaphragm disposed over the substrate and covering the hollow chamber;
a coil embedded in the diaphragm;
a circuit board attached to the substrate, wherein at least one vent hole passes through a top surface and a bottom surface of the circuit board; and
at least one acoustic mesh disposed on the bottom surface of the circuit board to cover the at least one vent hole, wherein the at least one acoustic mesh has a plurality of pores to allow sound to pass through, and the pores are smaller than the at least one vent hole, wherein an average open area percentage of the pores is greater than 0.1% and less than 20%.

2. The micro speaker structure as claimed in claim 1, wherein a size of each of the pores is greater than 0.1 μm and less than 20 μm.

3. The micro speaker structure as claimed in claim 1, wherein the at least one acoustic mesh comprises a plurality of acoustic meshes, and the acoustic meshes are stacked on top of each other on the bottom surface of the circuit board.

4. The micro speaker structure as claimed in claim 3, wherein the acoustic meshes have the same spore size and the same average open area percentage.

5. The micro speaker structure as claimed in claim 3, wherein the acoustic meshes have different pore sizes and different average open area percentages.

6. The micro speaker structure as claimed in claim 1, wherein the at least one acoustic mesh comprises a plurality of acoustic meshes, and the acoustic meshes are arranged side by side on the bottom surface of the circuit board.

7. The micro speaker structure as claimed in claim 6, wherein the acoustic meshes have different pore sizes and different average open area percentages.

8. The micro speaker structure as claimed in claim 1, further comprising:
a first permanent magnetic element disposed on the top surface of the circuit board and in the hollow chamber.

9. The micro speaker structure as claimed in claim 8, wherein the circuit board has a cavity recessed from the top surface of the circuit board, wherein the cavity is configured to accommodate the first permanent magnetic element.

10. The micro speaker structure as claimed in claim 8, wherein the at least one vent hole comprises a plurality of vent holes, and the vent holes are disposed around the first permanent magnetic element.

11. The micro speaker structure as claimed in claim 1, further comprising:
a lid wrapped around the substrate and the diaphragm, wherein the lid has an air opening that exposes a portion of the top surface of the diaphragm.

12. The micro speaker structure as claimed in claim 11, wherein the lid is made of a metal material having a magnetic permeability that is lower than $1.25 \times 10^{-4}$ H/m.

13. The micro speaker structure as claimed in claim 11, further comprising:
a second permanent magnetic element disposed on the lid, wherein the second permanent magnetic element is located below or above the air opening.

14. The micro speaker structure as claimed in claim 1, wherein the coil comprises a first metal layer and a second metal layer, and
wherein the first metal layer has a spiral structure surrounding a central axis of the diaphragm, and the second metal layer crosses over the spiral structure of the first metal layer and is electrically connected to the first metal layer.

15. A micro speaker structure, comprising:
a substrate having a hollow chamber;
a diaphragm disposed over the substrate and covering the hollow chamber;
a coil embedded in the diaphragm;
a circuit board attached to the substrate and having at least one vent hole, wherein the at least one vent hole is configured to allow the hollow chamber to communicate with an external environment;
at least one acoustic mesh disposed on a surface of the circuit board to cover the at least one vent hole, wherein the at least one acoustic mesh has a plurality of pores to allow sound to pass through, wherein a size of each of the pores is greater than 0.1 μm and less than 20 μm; and
a lid wrapped around the substrate and the diaphragm, wherein the lid has an air opening that exposes a portion of the top surface of the diaphragm.

16. The micro speaker structure as claimed in claim 15, wherein an average open area percentage of the pores is greater than 0.1% and less than 20%.

17. The micro speaker structure as claimed in claim 15, further comprising:
a first permanent magnetic element disposed on the circuit board and in the hollow chamber; and
a second permanent magnetic element disposed on the lid, wherein the first permanent magnetic element and the second permanent magnetic element are aligned in a vertical direction.

18. The micro speaker structure as claimed in claim 15, wherein the at least one acoustic mesh is disposed on the surface of the circuit board opposite the lid.

19. A micro speaker structure, comprising:
a substrate having a hollow chamber;
a diaphragm disposed over the substrate and covering the hollow chamber;
a coil embedded in the diaphragm;

a circuit board attached to the substrate and having at least one vent hole, wherein the at least one vent hole is configured to allow the hollow chamber to communicate with an external environment;

a permanent magnetic element disposed on a top surface of the circuit board facing the diaphragm and in the hollow chamber, wherein the circuit board further has a cavity recessed from the top surface of the circuit board for accommodating the permanent magnetic element;

at least one acoustic mesh disposed on a surface of the circuit board to cover the at least one vent hole, wherein the at least one acoustic mesh has a plurality of pores to allow sound to pass through, wherein a size of each of the pores is greater than 0.1 µm and less than 20 µm; and a lid wrapped around the substrate and the diaphragm, wherein the lid has an air opening that exposes a portion of the top surface of the diaphragm.

* * * * *